(12) United States Patent
Sullivan et al.

(10) Patent No.: US 9,482,951 B2
(45) Date of Patent: Nov. 1, 2016

(54) NON-COVALENTLY CROSSLINKABLE MATERIALS FOR PHOTOLITHOGRAPHY PROCESSES

(75) Inventors: Daniel M. Sullivan, Vichy, MO (US); Runhui Huang, Rolla, MO (US); Charles J. Neef, Rolla, MO (US); Jinhua Dai, Rolla, MO (US); Michael B. Swope, Belle, MO (US)

(73) Assignee: Brewer Science Inc., Rolla, MO (US)

( * ) Notice: Subject to any disclaimer, the term of this patent is extended or adjusted under 35 U.S.C. 154(b) by 1393 days.

(21) Appl. No.: 12/180,832

(22) Filed: Jul. 28, 2008

(65) Prior Publication Data

US 2009/0035590 A1 Feb. 5, 2009

Related U.S. Application Data

(60) Provisional application No. 60/952,667, filed on Jul. 30, 2007.

(51) Int. Cl.

| | |
|---|---|
| *B32B 27/06* | (2006.01) |
| *G03F 7/09* | (2006.01) |
| *C08F 212/14* | (2006.01) |
| *C08F 220/18* | (2006.01) |
| *C08F 220/34* | (2006.01) |
| *C08F 226/06* | (2006.01) |
| *G03F 7/11* | (2006.01) |
| *C08F 220/14* | (2006.01) |
| *C08F 220/26* | (2006.01) |
| *C08F 220/56* | (2006.01) |

(52) U.S. Cl.
CPC ............. *G03F 7/091* (2013.01); *C08F 212/14* (2013.01); *C08F 220/18* (2013.01); *C08F 220/34* (2013.01); *C08F 226/06* (2013.01); *G03F 7/11* (2013.01); *C08F 220/14* (2013.01); *C08F 220/26* (2013.01); *C08F 220/56* (2013.01); *Y10T 428/31678* (2015.04); *Y10T 428/31855* (2015.04); *Y10T 428/31935* (2015.04)

(58) Field of Classification Search
CPC .................................................... C08F 212/14
USPC .......................................................... 428/457
See application file for complete search history.

(56) References Cited

U.S. PATENT DOCUMENTS

| | | | | |
|---|---|---|---|---|
| 4,229,519 | A | | 10/1980 | Sharp et al. |
| 4,521,506 | A | * | 6/1985 | Stolzenburg et al. ........ 430/241 |
| 5,100,768 | A | * | 3/1992 | Niki et al. ................. 430/281.1 |
| 5,492,793 | A | * | 2/1996 | Breyta et al. .............. 430/270.1 |
| 7,364,835 | B2 | | 4/2008 | Bhave et al. |
| 2002/0051928 | A1 | | 5/2002 | Zampini |
| 2002/0142141 | A1 | * | 10/2002 | Miller ........................... 428/195 |
| 2002/0150732 | A1 | * | 10/2002 | Sarkar et al. ................. 428/195 |
| 2002/0172889 | A1 | | 11/2002 | Oohashi |
| 2003/0027076 | A1 | | 2/2003 | Szmanda |
| 2003/0087179 | A1 | | 5/2003 | Iwasaki |
| 2003/0118942 | A1 | | 6/2003 | Mitsumoto et al. |
| 2004/0259029 | A1 | | 12/2004 | Nagahara et al. |
| 2005/0047307 | A1 | | 3/2005 | Frommer et al. |

FOREIGN PATENT DOCUMENTS

| | | |
|---|---|---|
| EP | 0441524 | 8/1991 |
| JP | 09-106073 | 4/1997 |
| JP | 2985249 B2 * | 11/1999 |
| JP | 2000-356851 | 12/2000 |
| JP | 2002-225452 | 8/2002 |
| JP | 2003-066607 | 3/2003 |
| JP | 2004-211015 | 7/2004 |
| JP | 2006-030477 | 2/2006 |
| JP | 2009-543149 | 12/2009 |
| WO | 01/29115 | 4/2001 |
| WO | 02/064651 | 8/2002 |
| WO | 2008/010079 | 1/2008 |

OTHER PUBLICATIONS

English machine translation of Saito (JP 2985249); Aug. 11, 2011.*
Chemical Bonding; http://hyperphysics.phy-astr.gsu.edu/hbase/chemical/bond.html:Jul. 10, 2008.
Molecular Cell Biology; www.ncbi.nlm.nih.gov/books/bv.fcgi?rid=mcb.section.285; 2000;W.H. Freeman & Company.
Hydrogen Bonds; http://users.rcn,com/jkimball.ma.ultranet/BiologyPages/H/HydrogenBonds.html; Aug. 7, 2003.
Protecting Groups; http://www.organic-chemistry.org/protectivegroups/Jul. 11, 2008.
Hydrogen Bonding; http://webhost.bridgew.edu'fgorga/proteins/hydrogen_bonds.htm, Mar. 12, 2007.
Noncovalent Bonding; http://users.rcn.com/jkimball.ma.ultranet/BiologyPages/N/Noncovalent.html; Jul. 10, 2008.
International Search Report and Written Opinion in corresponding (PCT/US2008/071357) dated Feb. 3, 2009.
Chen et al., "Morphology and deformation behavior of polymer blends made of poly(styrene-co-styrenesulfonic acid) and poly(methyl methacrylate-co-4-vinylpyridine)," Polymer, vol. 45, No. 21, 2004, 7219-7227.
Huang et al., "Structure and Interaction of Organic /Inorganic Hybrid Nanocomposites for Microelectronic Applications. 1. MSSQ/P (MMA-co-DMAEMA) Nanocomposites," Chem. Mater., vol. 14, No. 9, 2002, 3676-3685.
International Preliminary Report on Patentability dated Nov. 12, 2009, in corresponding PCT/US2008/071357 filed on Jul. 28, 2008.
Xiang et al., "A novel synthesis of linear high-molecular-weight poly(4-vinylphenol) and poly[styrene-co-(4-vinylphenol)]," Macromol. Rapid Commun., 16, 477-481 (1995).

* cited by examiner

*Primary Examiner* — Michael Pepitone
(74) *Attorney, Agent, or Firm* — Hovey Williams LLP

(57) ABSTRACT

This invention describes compositions and methods of using non-covalently crosslinked resin coatings for lithographic applications. These materials are designed to undergo, after coating, a change that provides solvent resistance and, with some materials, simultaneous aqueous-base solubility. Non-covalent interactions allow for easier removal of these coatings than of covalently crosslinked materials. These types of materials are well-suited for trench and gap fill applications, as well as for anti-reflective coatings, spin-on carbon layers, and etch masks.

24 Claims, 4 Drawing Sheets

NON-COVALENTLY CROSSLINKABLE MATERIALS FOR PHOTOLITHOGRAPHY PROCESSES

RELATED APPLICATIONS

This application claims the priority benefit of a provisional application entitled GAP-FILL MATERIALS FOR PHOTOLITHOGRAPHY PROCESSES, Ser. No. 60/952,667, filed Jul. 30, 2007, incorporated by reference herein.

BACKGROUND OF THE INVENTION

1. Field of the Invention

The present invention is broadly concerned with novel, resin compositions and methods of using the same to form non-covalently crosslinked compositions useful in forming gap fill materials, etch mask compositions, spin-on carbon compositions, and anti-reflective coating compositions for lithography processes that are soluble in aqueous alkaline developers.

2. Description of the Prior Art

1. Fill Compositions

Integrated circuit manufacturers are consistently seeking to maximize substrate wafer sizes and minimize device feature dimensions in order to improve yield, reduce unit case, and increase on-chip computing power. As integrated circuit devices grow smaller, there is an increasing need for multi-level interconnects of smaller size and improved feature integrity. The damascene integration scheme is one way to allow for increasing chip densities on a substrate as design rules continue to shrink integrated circuit devices. The damascene process eliminates the need to etch the metal layer that provides the interconnections, permits more densely spaced interconnects, and eliminates the need for dielectric gap-fill materials.

There are two general classes of damascene processes: single damascene and dual damascene. The single damascene process fabricates interconnections by forming a conducting plug through a dielectric layer to connect to the underlying conducting layer. Another dielectric layer is then formed, with the actual interconnect wiring metallization being patterned in the second layer. The dual damascene process constructs multi-level interconnects of smaller size than the single damascene process. The via and trench patterns are patterned into a single dielectric layer and then filled in one step with a conducting material such as a metal. Dual damascene processes involve fewer steps, resulting in smaller, more complex integrated circuit devices, thus lowering manufacturing complexity and cost.

Despite the advantages of dual damascene processes, patterning and etch processes are made more difficult because of feature topography and more complex stack layers. Several techniques have been developed to address such problems, including self-aligned dual damascene, trench-first dual damascene, and via-first dual damascene processes. The application of self-aligned dual damascene is limited, because it requires a thick, intermediate layer to act as an anti-reflective layer, nearly perfect trench and via alignment, and very high etch selectivity between the dielectric and etch-stop layers. Trench-first dual damascene processes involve first masking and etching the trench, and then aligning the via pattern with the newly etched trenches. Successful trench-first dual damascene processes require achieving very uniform trenches and maintaining critical dimension control of vias, which in turn requires high etch selectivity between the dielectric and etch-stop layers. The use of etch-stop layers may also increase the dielectric constant of the dielectric material, possibly leading to device failure.

Via-first dual damascene is a somewhat simpler technique, because the vias are formed on top of the full stack of layers. The vias are etched, followed by lithography processes to form the trench patterns. Via-first dual damascene requires a fill composition capable of protecting the bottom of the via during the trench etch step, and of planarizing the surface to allow easier trench patterning. An organic material is typically used to partially or completely fill the via or contact holes and to protect the bottom and sidewalls from further etch attack during trench etching. In partial fill processes, the gap fill material protects only the bottoms of the via holes, requiring consistent coverage and depth control. In full-fill processes, the vias are completely filled and the layer is planarized. These organic fill materials can also serve as a bottom anti-reflective coating (as discussed below) to reduce or eliminate pattern degradation and line width variation in the patterning of the trench layer, provided the fill material covers the surface of the dielectric layer. After the fill processes, the etching process is performed on the top layer.

Once the structures are filled with gap fill material, the material is then coated with an organic anti-reflective coating layer- and then a photoresist layer. The photoresist is imaged and then the pattern is then transferred down into the substrate using reactive ion etch. In this process, there is almost always residual gap fill material remaining in the structure (via or trench) in the dielectric layer that needs to be removed. This also occurs in trilayer processes where the substrate is coated with a spin-on carbon material that also fills the vias and trenches, instead of a gap fill material. The spin-on carbon layer is then coated with an inorganic hardmask layer, and then a photoresist layer.

The conventional method of removal of the gap fill or spin-on carbon material from the vias and trenches has been to use a high powered oxygen plasma, called an ash process, which essentially burns away the material. This technique was suitable for older technology; however, as the industry moves toward lower k dielectrics, potential problems arise. For example, these low-k dielectrics are usually organic, instead of inorganic, and some are porous. Thus, these new dielectric materials are very susceptible to etch damage, especially from the oxygen ash process. One concern is that the conventional clean-out techniques can cause an increase in the dielectric constant of the material, which negates the purpose of a low-k dielectric to begin with.

2. Anti-Reflective Coatings

During photoresist patterning steps, it is necessary to control reflections from underlying materials through use of an anti-reflective coating to prevent distortion of the photoresist pattern. If the gap-fill material has suitable light-absorbing properties, it can also serve as the anti-reflective layer. Alternatively, an anti-reflective layer can be applied over the gap-fill material before applying the photoresist. While anti-reflective coatings are effective at preventing or minimizing reflection, their use requires an additional breakthrough step in the process in order to remove the coatings. This necessarily results in an increased process cost.

One solution to this problem has been the use of wet developable anti-reflective coatings. These types of coating can be removed along with the exposed areas of the photoresist material. That is, after the photoresist layer is exposed to light through a patterned mask, the exposed areas of the photoresist are wet developable and are subsequently removed with an aqueous developer to leave behind the desired trench and hole pattern. Wet-developable bottom anti-reflective coatings have typically utilized a polyamic acid soluble in alkaline media as a polymer binder, thus allowing the bottom anti-reflective coating to be removed when the resist is developed. These traditional wet-developable bottom anti-reflective coatings are rendered insoluble in resist solvents taking advantage of a thermally driven amic acid-to-imide conversion. This process works well, however, it has two limitations: (1) the bake temperature window where the bottom anti-reflective coating remains insoluble in organic solvents but soluble in alkaline developer can be narrow (less than 10° C.) due to the covalent crosslinking in the cured layer; and (2) the wet-develop process is isotropic, meaning the bottom anti-reflective coating is removed vertically at the same rate as horizontally, which leads to undercutting of the resist lines. While this is not a problem with larger geometries (greater than 0.2 micron), it can easily lead to line lifting and line collapse at smaller line sizes.

Thus, there is a need for gap fill materials, etch mask compositions, spin-on carbon compositions, and anti-reflective coating compositions, which are removed by conventional photoresist developers while simultaneously exhibiting good coating and optical properties. Control of the rate in which the wet-developable coating dissolves in the developer is also an important factor, and wide bake windows are favorable. There is also a need for gap fill and spin-on carbon materials and methods of removing these materials from vias and trenches that avoids the problems of conventional clean-out methods.

SUMMARY OF THE INVENTION

The present invention overcomes the problems of the prior art by providing new, non-covalently crosslinkable gap fill, etch mask, spin-on carbon, and anti-reflective coating compositions that are useful in lithography processes.

In more detail, there is provided the combination of a substrate having a surface; and a non-covalently crosslinked layer adjacent the surface. The layer is formed from a composition comprising a polymer dissolved or dispersed in a solvent system.

In another embodiment, there is provided a method of forming a structure for use in microlithographic processes. The inventive method includes providing a substrate having a surface, and applying a composition to at least a portion of that surface. The composition is then baked to yield a non-covalently crosslinked layer.

An anti-reflective or fill composition is also provided. The novel composition comprises a polymer dispersed or dissolved in a solvent system. The polymer comprises recurring monomers of

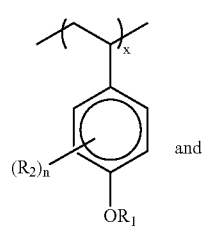

(I)

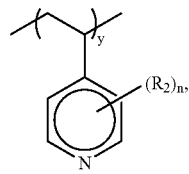

(II)

In the above formulas, n is 0-4, and the molar ratio of x:y is from about 1:3 to about 3:1. $R_1$ is a protecting group, and each $R_2$ is individually selected from the group consisting of alkyls, halogens, —OH, and multifunctional phenols.

The present invention is also concerned with the combination of a substrate having a surface and a layer adjacent the substrate surface. This layer comprises a non-covalently crosslinked compound comprising linkages having the formula selected from the group consisting of —OH—O, —OH—N, —NH—O, or —NH—N, and combinations of the foregoing.

The present invention also provides an inventive polymer comprising recurring monomers of

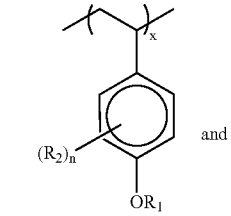

(I)

and

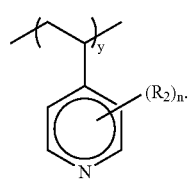

(II)

In the above formulas, n is 0-4, and the molar ratio of x:y is from about 1:3 to about 3:1. In addition, $R_1$ is selected from the group consisting of

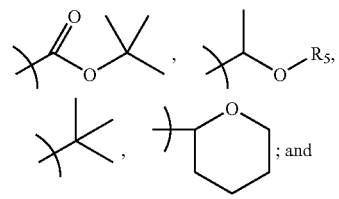

each: $R_2$ is individually selected from the group consisting of alkyls, halogens, —OH, and multifunctional phenols; and $R_5$ is selected from the group consisting of alkyls.

BRIEF DESCRIPTION OF THE DRAWINGS

FIG. 1(*a*) shows the cross-section of a wafer having via holes that have been coated with the inventive composition and baked to induce non-covalent crosslinking;

FIG. 1(*b*) shows the cross-section of a coated wafer after 60 seconds of developer contact;

FIG. 1(c) shows the cross-section of a coated wafer after 100 seconds of developer contact;

FIG. 2(a) shows the cross-section of a wafer having trenches that have been coated with the inventive composition and baked to induce non-covalent crosslinking;

FIG. 2(b) shows the cross-section of a coated wafer after 50 seconds of developer contact;

FIG. 3(a) shows the cross-section of a wafer that has been subjected to a 60-second $CF_4$ plasma etch;

FIG. 3(b) shows the cross-section of the wafer after a subsequent 5-second $O_2$ plasma etch;

FIG. 3(c) shows the cross-section of the wafer after the etching steps and subsequent contact with a developer for 120 seconds to remove the composition from the structure.

DETAILED DESCRIPTION OF THE PREFERRED EMBODIMENTS

Figure 1:
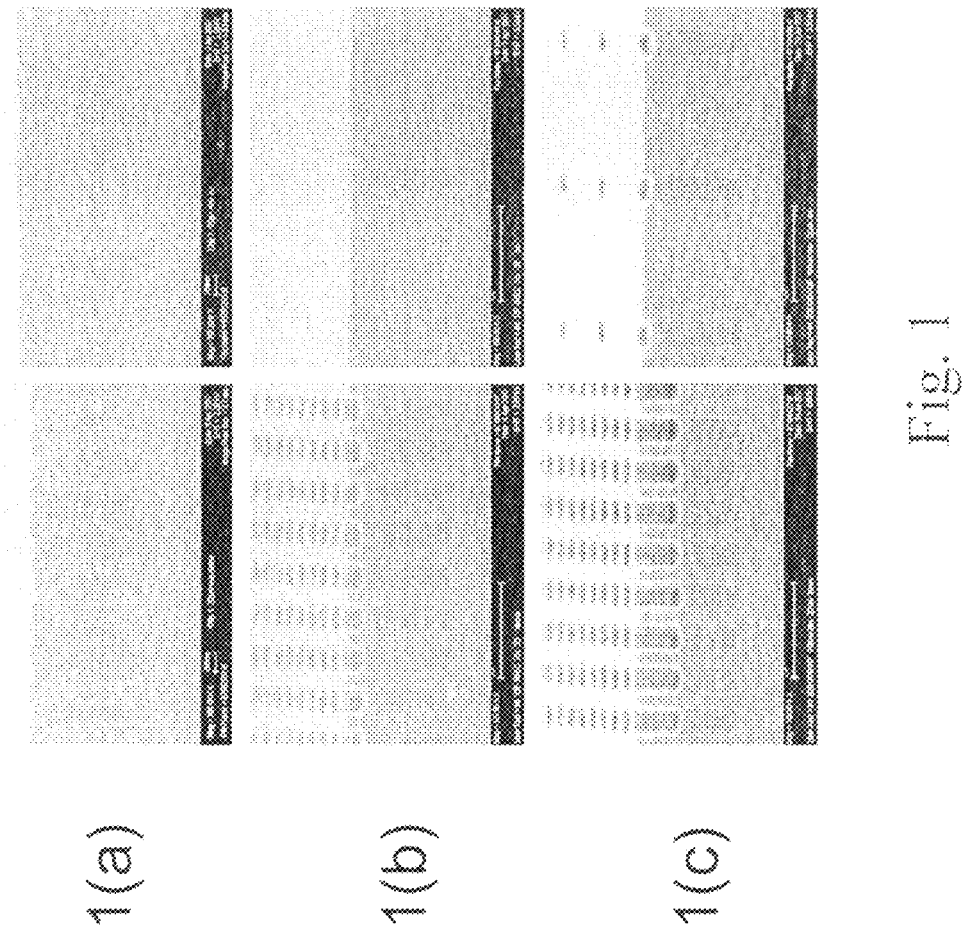
FIG. 1 illustrates wafers throughout the gap fill and development process in Example 3.

The present invention is broadly concerned with new non-covalently crosslinkable compositions that are useful in forming microlithographic structures, such as dual damascene structures. Such compositions include anti-reflective compositions, gap fill compositions, spin-on carbon compositions, and etch mask compositions.

In more detail, the inventive compositions can be any suitable formulation that relies on a non-covalent mode of crosslinking. As used herein, the terms "non-covalent crosslinking," "non-covalently crosslinked," or "non-covalently crosslinkable" are used to refer to crosslinking that does not involve the intimate sharing of pairs of electrons, as in covalent bonding, but rather involves more dispersed variations of electromagnetic interactions. Preferred examples of non-covalent crosslinking include hydrogen bonding and electrostatic intermolecular attraction. Hydrogen bonding occurs when a hydrogen covalently bonded to an O, N, or F on the "donor" atom is attracted to an electronegative atom on the "acceptor" atom. Common examples of such bonding include —OH—N, —OH—O, —NH—O, and —NH—N. It has been discovered that hydrogen bonds can be used to non-covalently crosslink polymers for gap fill materials, anti-reflective coatings, spin-on carbon compositions, and etch mask compositions to provide compositions with properties not achieved before.

For example, according to one embodiment, these non-covalently crosslinked compositions are wet developable (i.e., soluble in aqueous developers). That is, conventional crosslinked compositions are formed using covalent bonds (bond energy>100 kJ/mol) that generally require a first reaction to crosslink the composition and render it insoluble in typical resist solvents, and a second thermal, chemical, or photochemical reaction to render the composition developer soluble. It has been found that weaker non-covalent interactions (bond energy<100 kJ/mol) can provide solvent resistance like traditional covalent crosslinking, but they can also be disrupted by the base developer, which dissolves or removes the compositions. Thus, these non-covalently crosslinked compositions can be rendered simultaneously solvent resistant, but wet developable in a single crosslinking or curing step.

It has also been found that certain non-covalent interactions provide solvent resistance, but are not wet developable. That is, they cannot be removed by conventional aqueous developers; however, unlike covalently crosslinked compositions, they can be removed by chemical strippers that are stronger than conventional aqueous developers, but still less aggressive than conventional strippers. Advantageously, these types of intermediate strength strippers are safe for use with low-k dielectric materials. Thus, these compositions are especially well-suited for gap filling methods that involve low-k dielectric materials when a wet developable composition is not desired. This is because residual material can still be easily removed from vias and trenches using these less aggressive strippers, which avoids the traditional etch clean out process required for covalently crosslinked compositions. According to this aspect, preferred non-covalent crosslinking involves slightly stronger bonds such as electrostatic bonding.

Regardless of the embodiment, the inventive compositions comprise a polymer dispersed or dissolved in a solvent system. Preferred polymers include those that contain functional groups that contribute to the desired non-covalent bonding. The preferred method of obtaining polymers is by chain polymerization, and more preferably by use of a free radical initiator. The polymers may be composed entirely of monomers that contribute to bonding or may be a mixture of bonding and nonbonding monomers. Monomers are considered to be bonding monomers if they are either hydrogen bond donors or acceptors, or ionic in nature. Common hydrogen bond donors can include any functional group with a hydrogen atom covalently bonded to an oxygen, nitrogen, or fluorine atom. Preferred functional groups include, but are not limited to, phenols, alcohols, primary and secondary amines, amides, ureas, thiol ureas, or any group containing a proton in proximity of electron withdrawing groups. Common hydrogen bond acceptors can include any group with an electronegative force. Preferred acceptor groups include but are not limited to, tertiary amines, ethers, thiol esters, cyano, phosphine oxides, carbonyl, or sulfonyl groups. It is preferred that the molar ratio of hydrogen bond donor to acceptor in the polymer be from about 1:3 to about 3:1, preferably from about 2:3 to about 3:2, and most preferably about 1:1. Ionic functional groups can include a variety of organic acids or bases that are able to deprotonate or protonate to form ions. Examples of preferred ionic functional groups include carboxylic acids, sulfonic acids, and amines.

In a preferred embodiment, there is a protecting group on at least one of the bonding pairs (donor or acceptor). This protecting group minimizes bonding while in solution, and is removed during the bake/cure to allow for the formation of the non-covalent crosslinks. The protecting group can be any known protecting group, depending upon the respective functional groups of the bonding pairs. They are preferably acid labile. Furthermore, while the protecting group is typically covalently bonded to one of the bonding pairs, it could also be non-covalently bonded (e.g., electrostatically bonded) instead. Preferred protecting groups include weak or volatile acids such as acetic acid or pyridine as well as those selected from the group consisting of

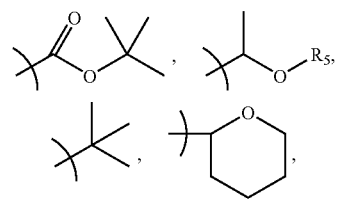

where $R_5$ is selected from the group consisting of alkyls (preferably $C_1$-$C_6$, and more preferably $C_1$-$C_4$).

The protecting group may cleave by only thermal means or with the aid of a catalyst. An exemplary deprotection mechanism is shown in Scheme A below with a t-butyl carbamate protecting group.

Scheme A

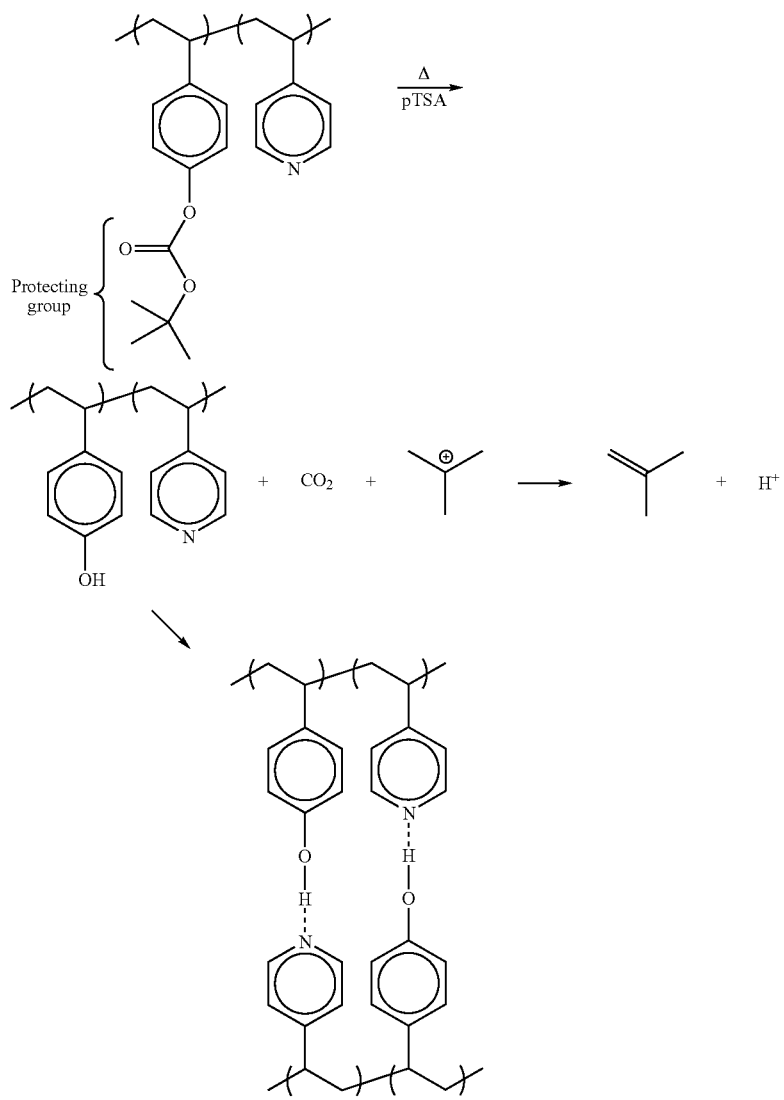

Preferred polymers for use in making the inventive compositions include recurring monomers selected from the group consisting of

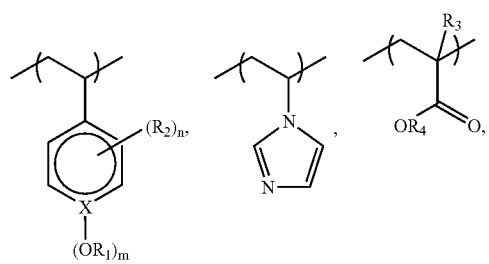

m = 0-1
n = 0-4 and combinations of the foregoing, where X is selected from the group consisting of —C— and —N—, $R_1$ is a protecting group such as those selected from the group consisting of

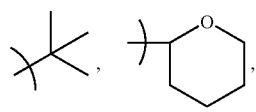

each: $R_2$ is individually selected from the group consisting of alkyls (preferably $C_1$-$C_6$, and more preferably $C_1$-$C_4$), halogens, —OH, and multifunctional phenols; $R_3$ is selected from the group consisting of H, alkyls (preferably $C_1$-$C_5$, and preferably methyl), —CN, —Br, and —Cl; $R_4$ is selected from the group consisting of alkyls (preferably $C_1$-$C_6$ alkyls, more preferably $C_1$-$C_4$ alkyls),

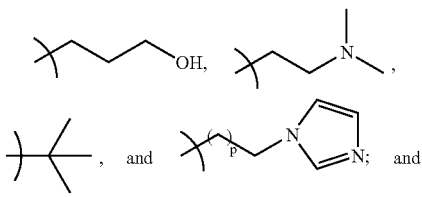

$R_5$ is selected from the group consisting of alkyls (preferably $C_1$-$C_6$, and more preferably $C_1$-$C_4$).

In certain embodiments where the composition is not wet developable, the preferred polymers for use in making the inventive compositions include recurring monomers selected from the group consisting of

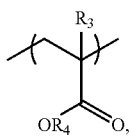

where $R_3$ is selected from the group consisting of H, alkyls (preferably $C_1$-$C_5$, and preferably methyl), —CN, —Br, and —Cl; and $R_4$ is selected from the group consisting of alkyls (preferably $C_1$-$C_6$ alkyls, more preferably $C_1$-$C_4$ alkyls),

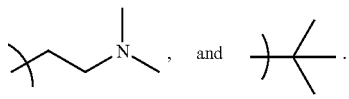

According to another preferred embodiment, the inventive compositions comprise a polymer that is a copolymer formed from

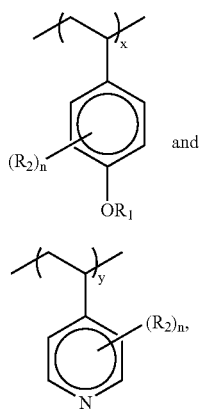

In the foregoing formulas: n can be from 0 to 4; $R_1$ is a protecting group such as those selected from the group consisting of

-continued

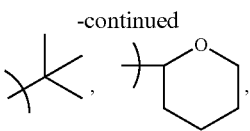

$R_2$ is selected from the group consisting of alkyls (preferably $C_1$-$C_6$, and more preferably $C_1$-$C_4$), halogens, —OH, and multifunctional phenols; and $R_5$ is selected from the group consisting of alkyls (preferably $C_1$-$C_6$, and more preferably $C_1$-$C_4$). It is preferred that the molar ratio of formula (I) to formula (II) in the polymer be from about 1:3 to about 3:1, preferably from about 2:3 to about 3:2, and most preferably about 1:1. Preferably, compositions formed in this embodiment are wet developable.

Regardless of the embodiment, the compositions are formed by simply dispersing or dissolving the polymers in the solvent system, preferably at ambient conditions and for a sufficient amount of time to form a substantially homogeneous dispersion. The polymer should be present in the composition at a level of from about 1% to about 40% by weight, more preferably from about 5% to about 25% by weight, and even more preferably from about 5% to about 15% by weight, based upon the total weight of solids in the composition taken as 100% by weight. The weight average molecular weight of this polymer is preferably from about 1,000 Daltons to about 1,000,000 Daltons, and more preferably from about 10,000 Daltons to about 100,000 Daltons.

Where the polymer is used to form a spin-on carbon composition, the polymer should be provided at sufficient levels so that the carbon levels in the composition are at least about 75% carbon atoms, preferably at least about 80% carbon atoms, and even more preferably from about 80% to about 95% carbon atoms, based upon the total number of atoms in all the solids in the composition taken as 100%. One having ordinary skill in the art can readily calculate this percentage based upon the chemical structure of the solids included in the composition. Alternatively, the carbon atom and total atom contents can be analyzed and calculated using known analytical equipment, including x-ray fluorescence spectroscopy, auger spectroscopy, and secondary ion mass spectroscopy. To achieve these carbon atom levels, the polymer is typically included in the composition at levels of from about 3% to and about 15% by weight, and more preferably from about 5% to about 10% by weight, based upon the total weight of solids in the composition taken as 100% by weight.

Preferred solvent systems include a solvent selected from the group consisting of propylene glycol methyl ether acetate ("PGMEA"), propylene glycol methyl ether ("PGME"), ethyl lactate ("EL"), and mixtures thereof. The solvent system should have a boiling point of from about 50° C. to about 250° C., and more preferably from about 150° C. to about 200° C., and should be utilized at a level of from about 60% to about 99% by weight, preferably from about 75% to about 95% by weight, and even more preferably from about 85% to about 92% by weight, based upon the total weight of the composition taken as 100% by weight. Thus, the percent solids in the composition will be from about 1% to about 40% by weight, preferably from about 5% to about 25% by weight, and more preferably from about 8 to about 15% by weight, based upon the total weight of the composition taken as 100% by weight.

The extent of bonding may also be controlled by the addition of a bond-disrupting agent to the composition. This agent acts by bonding to one of the bonding pairs in solution and through the curing process, thereby preventing it from crosslinking to the other bonding pair. By modifying the amount of the bond-disrupting agent added to the composition the develop rate of the cured composition can be easily adjusted. If used, the bond-disrupting agent should be present in the composition at a level of from about 0.5% to about 12% by weight, and preferably from about 1% to about 7% by weight, based upon the total weight of solids in the composition taken as 100% by weight. Preferred bond-disrupting agents are any species that bond more strongly to one of the bonding pairs in the system than the other pair. Such bond-disrupting agents can be proton donating species such fluorinated alcohols (e.g., hexafluoro isopropanol, trifluoro ethanol) and sulfonamides. Preferred proton donating species also include acids such as —COOH, mineral acid, and sulfonic acids. Particularly preferred acids are selected from the group consisting of p-toluene sulfonic acid ("pTSA"), methane sulfonic acid ("MSA"), camphor sulfonic acid ("CSA"), and mixtures of the foregoing.

The bond-disrupting species can also be a proton accepting species, which can be used as the bond disrupting agent and bond to one of the pairs after the deprotection process. Preferred proton accepting species includes bases. Suitable bases for use as a bond disrupting agent include bases selected from the group consisting of amines (e.g., TMAH, triethylamine, pyridine, imidazole, piperidine).

It will be appreciated that a number of other optional ingredients can be included in the compositions as well. Typical optional ingredients include surfactants, catalysts, and adhesion promoters.

The inventive methods comprise applying (e.g., by spin-coating) a composition to a substrate so as to form a layer of that composition on the substrate surface. The substrate utilized will preferably include topography (e.g., contact holes, via holes, raised features, and trenches). This topography can be included directly on the substrate surface, or it can be included in one or more layers of other material formed on the substrate surface. The substrate can be any microelectronic substrate. Preferred substrates include those selected from the group consisting of silicon, aluminum, tungsten, tungsten silicide, gallium arsenide, germanium, tantalum, tantalum nitrite, silicon germanium, silicon dioxide, silicon nitride, aluminum oxide, glass, quartz, and low-k dielectrics. The low-k dielectric layer might be formed directly on the substrate, or it might be formed on other layers that have first been formed on the substrate (e.g., gate, contact, etch stop layers). The dielectric layer and any other layers are formed according to conventional processes.

This composition can be applied to the substrate at any number of average thicknesses depending upon the final use, but will typically be initially applied at thicknesses of from about 0.3 nm to about 3,000 nm. It is preferred that the composition be applied to the substrate in sufficient quantities to substantially planarize the substrate surface. The composition layer is then baked to form a non-covalently crosslinked (i.e., cured) layer. The baking temperatures and times affect the degree of deprotection and subsequent non-covalent crosslinking of the bonding groups, and therefore ultimately the amount of film remaining after contacting the composition with a developer. It is preferred that the degree of deprotection after baking be at least about 75% complete, preferably from about 75% to about 90% complete, and more preferably from about 90% to about 100% complete. This is generally accomplished by heating at a temperature from about 130° C. to about 300° C., and preferably from about 150° C. to about 225° C., for a time period of from about 30 seconds to about 120 seconds, and more preferably from about 45 seconds to about 90 seconds. The degree of deprotection is preferably measured by FTIR. The average thickness of the non-covalently crosslinked layer will typically be from about 0.1 nm to about 2,000 nm, and preferably from about 20 nm to about 500 nm.

In a preferred embodiment, the non-covalently crosslinked layer will have the formula

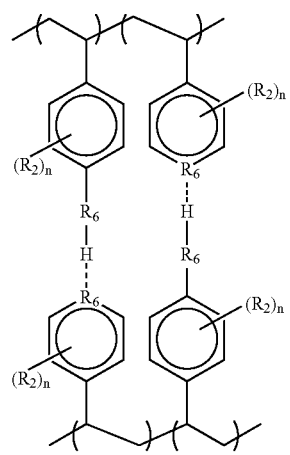

where: n is 0-4; each $R_2$ is individually selected from the group consisting of alkyls (preferably $C_1$-$C_6$, and more preferably $C_1$-$C_4$), halogens, —OH, and multifunctional phenols; and each $R_6$ is individually selected from the group consisting of —O— and —N—.

Advantageously, the non-covalently crosslinked layer will be substantially insoluble in typical photoresist solvents, such as ethyl lactate, PGME, or PGMEA. Thus, when subjected to a stripping test, the non-covalently crosslinked layer will have a percent stripping of less than about 5%, preferably less than about 1%, and even more preferably about 0%. The stripping test involves first determining the thickness (by taking the average of measurements at five different locations) of the non-covalently crosslinked layer. This is the initial average film thickness. Next, a photoresist solvent is puddled onto the cured film for about 20 seconds, followed by spin drying at about 2,500 rpm for about 30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

Although the non-covalently crosslinked layer is substantially insoluble in the photoresist solvent, according to a preferred embodiment, it is substantially soluble in photoresist developers. That is, the cured layer is wet developable, meaning that the composition can be removed with conventional aqueous developers such as tetramethyl ammonium hydroxide (Scheme B).

Scheme B

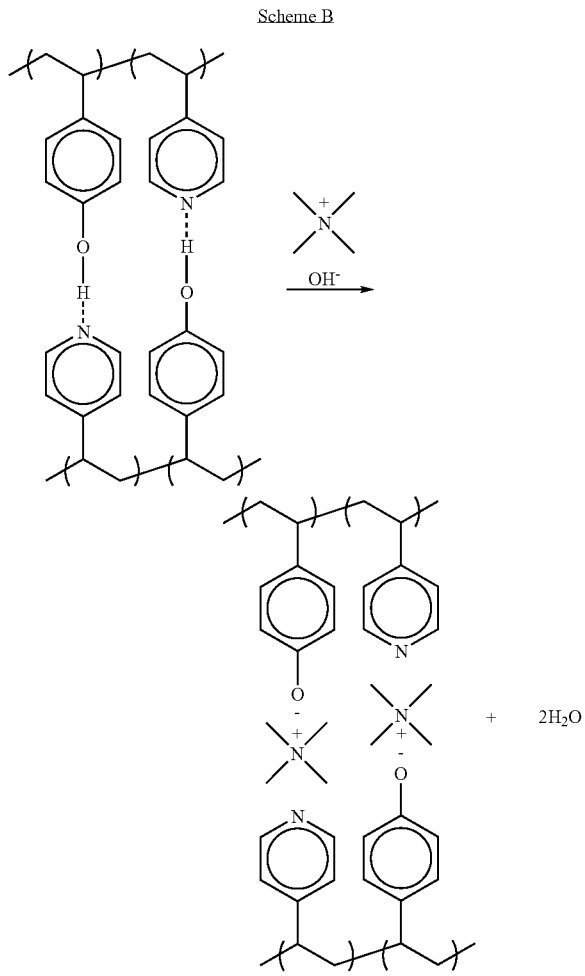

Thus, according to one aspect of the inventive method, a developer is puddled on the cured layer so as to remove (recess) at least some of the layer. The developer is removed (e.g., by spinning) from the cured layer, and the layer structure is further processed as necessary for its intended final use. In more detail, the developer is puddled onto the layer and is preferably allowed to contact the layer for a time period of from about 30 seconds to about 90 seconds, more preferably from about 45 seconds to about 80 seconds, and even more preferably from about 55 seconds to about 65 seconds. The developer is then removed from the substrate, preferably by rinsing with water and spinning at a speed of from about 1,500 rpm to about 2,500 rpm for a time period of from about 20 seconds to about 40 seconds. The developer is preferably a commercially available aqueous developer solution comprising a base, which "decrosslinks" the composition, rendering it soluble in the developer. Particularly preferred developers include those selected from the group consisting of tetramethyl ammonium hydroxide (shown above), potassium hydroxide, sodium hydroxide, and mixtures thereof.

When comparing the thickness of the layer prior to developer contact to the thickness of the layer after developer contact, it can be seen that the developer contact results in the layer being at least partially removed or recessed. Thus, when measured with a resist development analyzer, the developer contact preferably removes or recesses the composition at a rate of from about 1 Å to about 500 Å of thickness per second of developer contact (i.e., the develop rate), more preferably from about 10 Å to about 300 Å of thickness per second of developer contact, and even more preferably from about 20 Å to about 200 Å of thickness per second of developer contact. The amount of recess can be to a level above, at, or below the upper edge of the vias, depending upon the application. If the material is recessed to a point above the upper edge of the vias, the remaining film can be used as an anti-reflective layer at its first or second reflective minimum thickness. If the material is recessed to a level at or below the upper edge of the vias, the material will act only as a gap filling material, and another anti-reflective coating layer is preferably applied to suppress light reflecting from the substrate. Having the material recessed to partially fill the vias can be advantageous because less bottom anti-reflective coating must be etched.

Minimization of the material that must be etched in the vias results in reduced fencing or crown formation after trench etch. Fences or crowns are bottom anti-reflective coating or dielectric residue that remains after the trench etch because of poor etch selectivity between the via-fill, bottom anti-reflective coating and the interlayer dielectric.

The inventive process can be used in both partial-fill (i.e., where from about 35% to about 65% of the hole's depth is filled with the composition) and full-fill (i.e., where at least about 95%, and preferably about 100%, of the hole's depth is filled with the composition) applications.

Furthermore, it will be appreciated that the inventive methods can be used to form dual damascene structures possessing properties not previously achieved. For example, the structures prepared according to the inventive methods will have low biases, even with very thin layers of the composition. Specifically, the inventive methods will result in layers having biases of less than about 20 nm, preferably less than about 10 nm, and more preferably from about 0 nm to about 5 nm, even at average film thicknesses of less than about 200 mm.

As used herein, the average thickness of a layer (except for when determining bias) is determined by measuring with an ellipsometer. These measurements are repeated over a wafer (or other area as defined herein) three times, and the measurements are averaged to determine the average thickness of a layer. When determining the thickness for bias purposes, an SEM photograph and imaging program (ImageJ) is used. The scale bar in the SEM is used to calibrate the measurement, and three measurements over each region (iso or dense) are averaged.

The bias is determined by subtracting the average thickness of a layer over a dense region from the average thickness of that same layer over an isolated region. A dense region is defined as a portion of a substrate that has at least about 50% of its surface area filled with via holes, while an isolated region is defined as a portion of a substrate that has less than about 20% of its surface area filled with via holes.

A photoresist layer can then be applied to the recessed composition (or to intermediate layers such as an anti-reflective coating applied on the recessed composition, or a hardmask applied on the composition when it is used as a spin-on carbon), with the photoresist layer being patterned according to conventional processes (e.g., exposure to activating radiation at the wavelength of interest, developing the exposed photoresist, etch transfer of the pattern). Because the inventive method is particularly well-suited for via-first methods, this patterning will typically involve patterning the desired trenches, followed by etching (e.g., plasma etching) of those trenches into the substrate. It will be appreciated that this method is particularly advantageous over the prior art because it is compatible with copper-containing circuits and avoids the issues typically encountered with methods where etching of copper is required.

The inventive compositions are also suitable for use as spin-on carbon layers in trilayer stacks. After it is applied to the substrate, the composition is not recessed back to the dielectric surface. Rather, a layer of the composition remains on the substrate surface and covering the vias. An inorganic hardmask is then applied to the composition followed by a photoresist. The inventive compositions can also be used as the hardmask or pattern transfer layer to transfer the pattern into the substrate. In this embodiment, it is preferred that a standard organic or inorganic anti-reflective coating be applied to the hardmask before application of the photoresist.

Regardless of the embodiment, the non-covalently cross-linked layers formed according to the invention preferably have an n value (i.e., real component of the complex index of refraction) of from about 1.2 to about 2.0, preferably from about 1.5 to about 1.9, and even more preferably about 1.78, and a k value (i.e., imaginary component of the complex index of refraction) of from about 0 to about 1, preferably from about 0.1 to about 0.9, and even more preferably about 0.85.

Finally, in embodiments where the composition is not a gap fill composition, these layers preferably etch equal to or more slowly than the substrate (e.g., dielectric) etches. That is, the substrate etch rate over the inventive composition etch rate will be from about 1 to about 5, and more preferably from about 1 to about 4 when an etchant such as $CF_4$ is used. Preferably, the composition will also etch more rapidly than will a Si hard mask. Thus, the inventive composition etch rate over a Si hard mask etch rate will be at least about 5, and preferably at least about 10, when $O_2$ is used as an etchant.

The present invention provides the advantage that regardless of the embodiment, these compositions can be easily removed from substrate structures (i.e., vias, trenches) after the pattern has been transferred to the substrate using an etch process. Thus, unlike prior art compositions, which require an oxygen ash process, the inventive compositions can be removed using a novel wet clean-out method. According to the inventive method, the wafer is simply immersed in a common aqueous developer or a chemical stripper, such as ACT® EZSTRIP™ 601 Remover (available from Air Products, using the manufacturers recommended time and temperature), and then rinsed with a solvent. The wafer is then baked at 100° C. for 60 seconds to remove any residual solvent from the substrate surface. Advantageously, the residual material is substantially completely removed from the structures. Preferred chemical strippers have intermediate strength and are safe for use with low-k dielectric materials. Suitable rinse solvents include ethyl lactate, PGME, PGMEA, and mixtures of the foregoing.

EXAMPLES

The following examples set forth preferred methods in accordance with the invention. It is to be understood, however, that these examples are provided by way of illustration and nothing therein should be taken as a limitation upon the overall scope of the invention.

Example 1

Preparation of Compositions for Development Rate Control by Varying Monomer Ratios 1. Preparation of Copolymers Polymer mother liquors were prepared by adding 4-vinylpyridine ("4-VPY," obtained from Sigma-Aldrich Co.), tert-butyl 4-vinylphenyl carbonate ("TBSM," obtained from DuPont), propylene glycol monomethyl ether ("PGME," obtained from Harcross Corp.), and 2,2'-azobis(2-methylpropionitrile) radical initiator ("AIBN," obtained from Sigma-Aldrich Co.) to a 100-ml round bottom flask. The flask was sealed and purged with nitrogen, and the mixture was stirred until the TBSM and AIBN were in solution.

Five different polymer mother liquors were prepared with varying monomer concentrations. The ingredients for each mother liquor are provided in Table 1 below.

TABLE 1

| Polymer Mother Liquor | 4-VPY (g) | TBSM (g) | PGME (g) | AIBN (g) |
|---|---|---|---|---|
| 1A | 1.26 | 6.17 | 66.87 | 0.33 |
| 1B | 1.68 | 5.29 | 62.73 | 0.33 |
| 1C | 2.10 | 4.40 | 58.50 | 0.33 |
| 1D | 2.52 | 3.52 | 54.36 | 0.33 |
| 1E | 2.94 | 2.64 | 50.22 | 0.33 |

After the reagents were in solution, the mixture was heated in a silicone oil bath and allowed to react at 60° C. for 16 hours. After 16 hours, the polymer solutions (Scheme C) were cooled to room temperature and bottled.

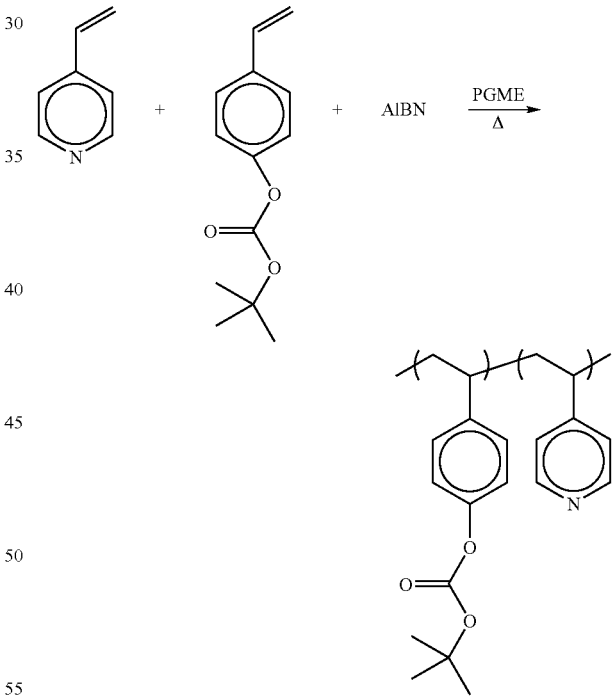

Scheme C

2. Preparation of Composition

Each of the polymer mother liquors prepared above was then used to make the compositions. The compositions were prepared by blending each of the polymer solutions with propylene glycol n-propyl ether ("PnP") and p-toluene sulfonic acid ("pTSA") in the amounts shown in Table 2 below. The ingredients were stirred, filtered through a 0.1-μm endpoint filter, and bottled. Each composition had the same formulation, except for the respective polymer mother liquors used to make each formulation.

TABLE 2

| Formulation | Percentage by Weight[a] |
|---|---|
| Polymer mother liquor (Table 1) | 20.00% |
| Propylene glycol n-propyl ether (PnP) | 79.96% |
| p-toluene sulfonic acid (pTSA) | 0.04% |

[a]Based upon the total weight of all ingredients in the composition taken as 100% by weight.

3. Composition Testing

The solvent resistance (stripping in Å) and film develop rates of each composition were then determined. For each test, the inventive compositions were spin-coated at 1,500 rpm for 60 seconds onto 100-mm silicon wafers. The wafers were then baked at 205° C. for 60 seconds using a contact hot plate to induce deprotection and non-covalent crosslinking of the composition (Scheme D).

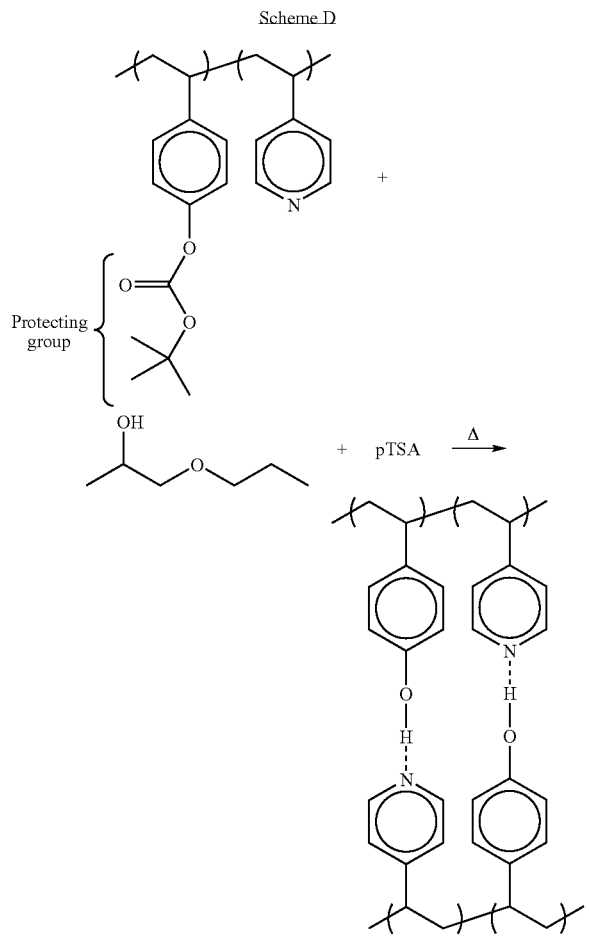

Scheme D

The thickness of the resulting film was measured using an ellipsometer. Solvent resistance tests were then performed by applying a common resist solvent (i.e., ethyl lactate) to the film for 20 seconds, followed by spin-drying at 2,500 rpm for 30 seconds.

Film develop rates were then measured using a resist development analyzer (RDA model 790, Litho Tech Japan). For the tests, silicon wafers were again coated with each composition and baked as described above to induce non-covalent crosslinking. Each wafer was then immersed in tetra-methylammonium hydroxide ("TMAH"), a standard base developer, while the analyzer measured the rate at which the film was removed. The develop rates for each composition, identified based upon the polymer mother liquor, are provided in Table 3 below.

TABLE 3

| Composition | Develop Rate (nm/s) |
|---|---|
| Polymer Mother Liquor 1A | 6.3 |
| Polymer Mother Liquor 1B | 2.2 |
| Polymer Mother Liquor 1C | 1.6 |
| Polymer Mother Liquor 1D | 2.5 |
| Polymer Mother Liquor 1E | 3.2 |

Inspection of the wafers after this test showed no remaining residue, indicating that the various formulations were completely removed by the developer. Therefore, the compositions were resistant to the solvent, while being simultaneously soluble in the resist developer.

Example 2

Preparation of Compositions for Develop Rate Control by Addition of a Bond-Disrupting Agent 1. Preparation of Composition In this example, the polymer mother liquor 1C from Example 1 above was used to prepare the inventive compositions. Various formulations were prepared by blending the polymer mother liquor and PnP, with increasing amounts of acid as the bond-disrupting agent. The ingredients and amounts for each formulation are listed in Table 4 below, with the percentages by weight being based upon the total amount of all ingredients in the composition take as 100% by weight. Each of the five formulations was prepared three times using three different acids (i.e., bond-disrupting agents): pTSA, methane sulfonic acid ("MSA," Sigma-Aldrich Co.), and camphor sulfonic acid ("CSA," Sigma-Aldrich Co.), for a total of 15 compositions.

TABLE 4

| Formulation | Bond-disrupting agent[A] | Polymer Mother Liquor (1C) | PnP |
|---|---|---|---|
| 2A | 0.04% | 20.0% | 79.94% |
| 2B | 0.08% | 20.0% | 79.92% |
| 2C | 0.12% | 20.0% | 79.88% |
| 2D | 0.16% | 20.0% | 79.84% |
| 2E | 0.20% | 20.0% | 79.80% |

[A]pTSA, MSA, or CSA

The solvent resistance and film develop rates of each composition were then determined using the same methods explained in Example 1 above. The results of the solvent resistance test are shown in the table below.

TABLE 5

| Formulation | Stripping (Å) with pTSA as acid | Stripping (Å) with MSA as acid | Stripping (Å) with CSA as acid |
|---|---|---|---|
| 2A | 1 | 6 | 2 |
| 2B | 4 | 4 | 1 |
| 2C | 4 | 10 | 1 |
| 2D | 8 | 9 | 1 |
| 2E | 8 | 7 | 3 |

The film develop rates for each formulation are provided in Table 6 below.

TABLE 6

| Formulation | Develop Rate with pTSA as acid (nm/s) | Develop Rate with MSA as acid (nm/s) | Develop Rate with CSA as acid (nm/s) |
| --- | --- | --- | --- |
| 2A | 1.6 | 2.0 | 2.0 |
| 2B | 5.1 | 5.6 | 6.0 |
| 2C | 12 | 13 | 12 |
| 2D | 26 | 19 | 47 |
| 2E | 73 | 35 | 156 |

Example 3

Preparation of Gap Fill Composition

1. Preparation of Copolymers

To prepare the polymer mother liquor, 14.01 grams of 4-VPY, 29.28 grams of TBSM, 105 grams of PGME, and 1.75 grams of AIBN were added to a 500-ml round bottom flask. The flask was sealed and purged with nitrogen, and the mixture was stirred until the TBSM and AIBN were in solution. The mixture was then heated in a silicone oil bath and allowed to react at 75° C. for 16 hours. After 16 hours, the polymer solution was cooled to room temperature and bottled. The solution had 30% solids.

2. Composition Preparation

The gap fill composition was prepared by mixing 6.40 grams of the polymer solution prepared above (1.92 grams of polymer solids and 4.48 grams of PGME) with 7.53 grams of PGME, 6.00 grams of propylene glycol methyl ether acetate (PGMEA), and 0.078 grams of pTSA. The composition mixture had a total weight of 20.01 grams, with 10% solids.

3. Gap Filling with Composition

The composition was spin-coated at 1,500 rpm for 60 seconds onto wafer substrates having via holes ranging in size from 0.13 μm to 0.3 μm. The coated wafers were then baked on a contact hot plate at 205° C. for 60 seconds to induce deprotection and non-covalent crosslinking of the composition.

The thickness of the film on the substrate ranged from 150 nm to 390 nm depending upon the topography (size and shape of via holes) present on the substrate surface. One of the coated wafers was tested for stripping in ethyl lactate. The initial film thickness was 390 nm, and the thickness after stripping was 389 nm (0.26% loss). Some of the coated wafers were then cross-sectioned and imaged using an SEM.

The remaining coated wafers were contacted with developer. A standard 0.26N TMAH developer was puddled onto the crosslinked layer of the coated wafers for either 60 or 100 seconds. The wafers were then rinsed with deionized (DI) water at 500 rpm for 5 seconds, followed by spin drying at 2,500 rpm for 60 seconds, and baked at 100° for 10 seconds to remove any residual water from the surface of the substrate. The developed wafers were cross-sectioned and imaged using an SEM. These images were compared to cross-sections of the undeveloped wafers coated with the inventive fill composition.

FIG. 1 illustrates the coated wafers before and after the development process. The wafer substrates that were imaged contained via holes that were 0.22 μm in diameter and 1.0 μm deep. FIG. 1(a) shows wafers that were coated with the inventive composition and baked at 205° C. for 60 seconds, but not developed. As can be seen in FIG. 1(a), the via holes were completely planarized after the composition was spin coated onto the substrate and baked. FIG. 1(b) shows a cross-section of wafers that were coated and baked at 205° C. for 60 seconds, followed by development for 60 seconds as described above. As can be seen in FIG. 1(b), the film composition was wet recessed to the via surface (to achieve full fill). FIG. 1(c) shows a cross-section of wafers that were baked at 205° C. for 60 seconds, followed by development for 100 seconds. As can be seen in FIG. 1(c), the film composition was wet recessed to below the upper edge of the via holes (to achieve partial fill).

Example 4

Trench-Fill Application

The composition from Example 3 was spin-coated at 1,500 rpm for 60 seconds onto wafer substrates containing patterned trenches ranging in widths of from 120 nm to 500 nm. The coated wafers were then baked on a contact hot plate at 205° C. for 60 seconds to induce the non-covalent crosslinking of the composition. Some of these undeveloped wafers were cross-sectioned and imaged using an SEM.

The remaining wafers were then developed using a standard 0.26N TMAH developer, which was puddled on the film for 50 seconds, followed by spin drying at 2,500 rpm for 60 seconds. The wafers were rinsed with deionized (DI) water at 500 rpm for 5 seconds, followed by spin drying at 2,500 rpm for 60 seconds, and baked at 100° C. for 10 seconds to remove any residual water from the surface of the substrate. The developed wafers were cross-sectioned and imaged using an SEM. These images were compared to cross-sections of the undeveloped wafers coated with the inventive film composition.

Figure 2:
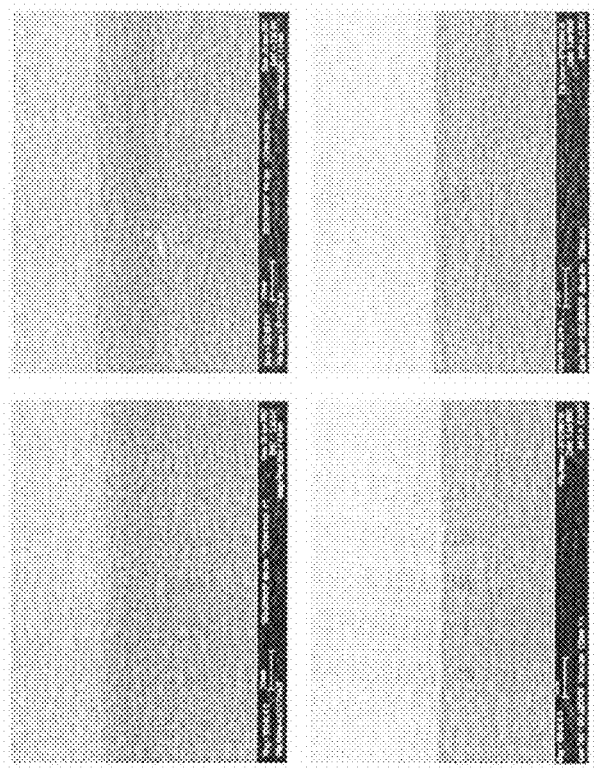
FIG. 2 illustrates wafers throughout the trench fill and development process in Example 4.

Cross-sections of the undeveloped wafers are shown in FIG. 2(a), and cross-sections of the developed wafers are shown in FIG. 2(b). As can be seen in FIG. 2(a), the substrate surface was completely planarized after the composition was spin coated onto the substrate and baked. In FIG. 2(b), it can be seen that the composition was wet recessed to the trench surface (achieving a full fill).

Example 5

Wet Removal of Gap Fill Composition from Structures after Plasma Etch

The gap fill composition from Example 3 was spin-coated at 1,500 rpm for 60 seconds onto wafer substrates having via holes ranging in size from 0.22 μm to 0.25 μm. The coated wafers were then baked on a contact hot plate for 60 seconds to induce the non-covalent crosslinking of the composition.

The via holes were completely planarized after the composition was spin coated onto the substrate and baked. The thickness of the film on the substrate ranged from 150 nm to 390 nm, depending upon the topography (size and shape of via holes) present on the substrate surface.

The film was then wet recessed to the via surface by puddling a standard 0.26N TMAH developer on the film of the wafers for 60 seconds, followed by spin drying at 2,500 rpm for 60 seconds. The wafers were then rinsed with deionized (DI) water at 500 rpm for 5 seconds, followed by spin drying at 2,500 rpm for 60 seconds, and baked at 100° C. for 10 seconds to remove any residual water from the surface of the substrate.

Figure 3:
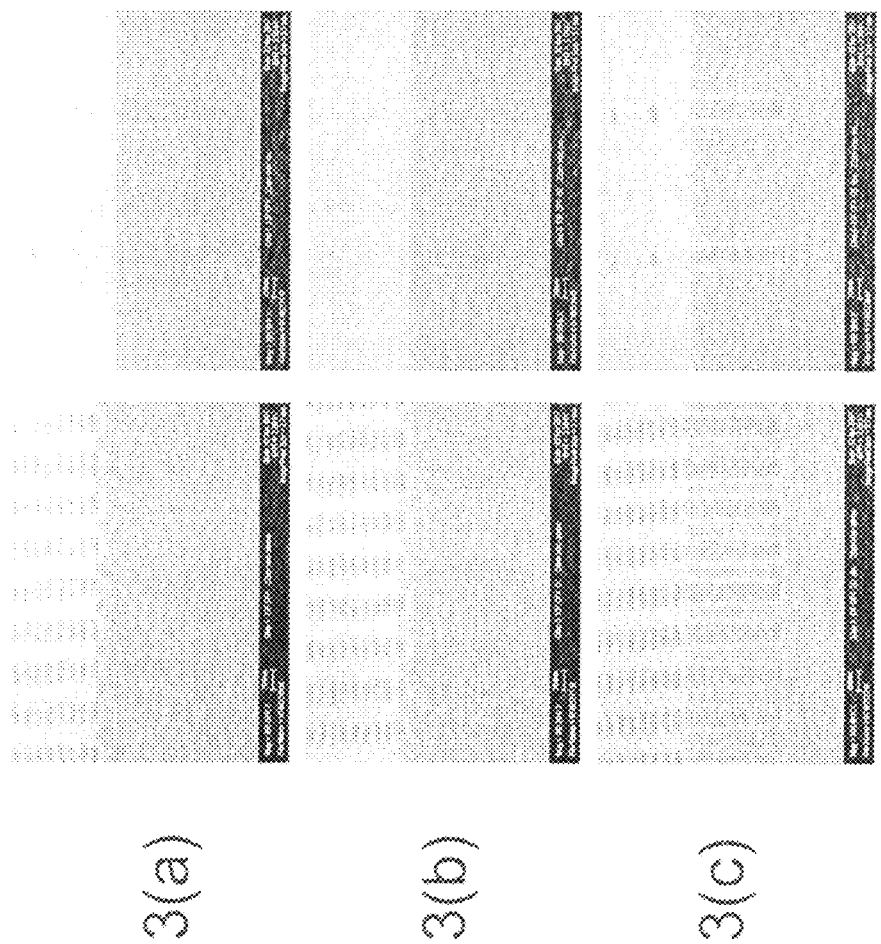
FIG. 3 illustrates wafers throughout the inventive wet removal process in Example 5.

FIG. 3 illustrates SEM pictures of the via fill throughout the wet removal process. The substrates were subjected to a 60-second $CF_4$ plasma etch (FIG. 3(a)), followed by a 5-second $O_2$ plasma etch (FIG. 3(b)). After etching, a developer (PD523AD, obtained from Moses Lake Industries, Inc.) was puddled on the via substrate for 120 seconds to remove the gap fill composition (FIG. 3(c)) from the structures. The gap fill composition retained the same develop rate after the plasma etch.

Example 6

Preparation of Compositions with Non-Crosslinking Monomer

1. Preparation of Copolymers

To prepare the polymer mother liquor, 1.35 grams of 4-VPY, 2.83 grams of TBSM, 1.67 grams of hydroxypropyl methacrylate ("HPMA," Sigma-Aldrich Co.), 24.0 grams of PGME, and 0.15 grams of AIBN were added to a 100-ml round-bottom flask. The flask was sealed and purged with nitrogen, and the mixture was stirred until the TBSM and AIBN were in solution. The mixture was then heated in a silicone oil bath and allowed to react at 75° C. for 16 hours. After 16 hours, the polymer solution was cooled to room temperature and bottled. The solution had 20% solids.

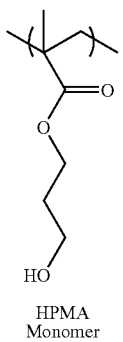

HPMA Monomer

2. Preparation of Composition

To prepare the inventive composition, 10 grams of the polymer solution prepared above (2.0 grams of polymer solids and 8.0 grams of PGME) were mixed with 10 grams of ethyl lactate. The composition mixture had a total weight of 20.0 grams, with 10% solids.

3. Testing

The solvent resistance and film develop rates of the composition were determined. For each test, the composition was spin-coated at 1,500 rpm for 60 seconds onto 100-mm silicon wafers. The coated wafers were baked at 205° C. for 60 seconds using a contact hot plate to induce non-covalent crosslinking of the composition. The thickness of the resulting film (cured layer) was measured using an ellipsometer. Solvent resistance tests were then performed by applying a 1:1 solution of PGME and PGMEA to the film for 20 seconds, followed by spin-drying at 2,500 rpm for 30 seconds. Subsequent film thickness measurements were made on the ellipsometer to determine the film loss. The composition showed resistance to the solvent, and only 1 nm of strip was observed.

Film develop rates were then measured using a resist development analyzer. A silicon wafer was again coated with the composition and baked as described above. The wafer was immersed in TMAH, while the analyzer measured the rate at which the film was removed. The composition had a develop rate of 12 nm/s in the TMAH.

The following reaction scheme shows the polymer preparation as well as the subsequent induced non-covalent crosslinking.

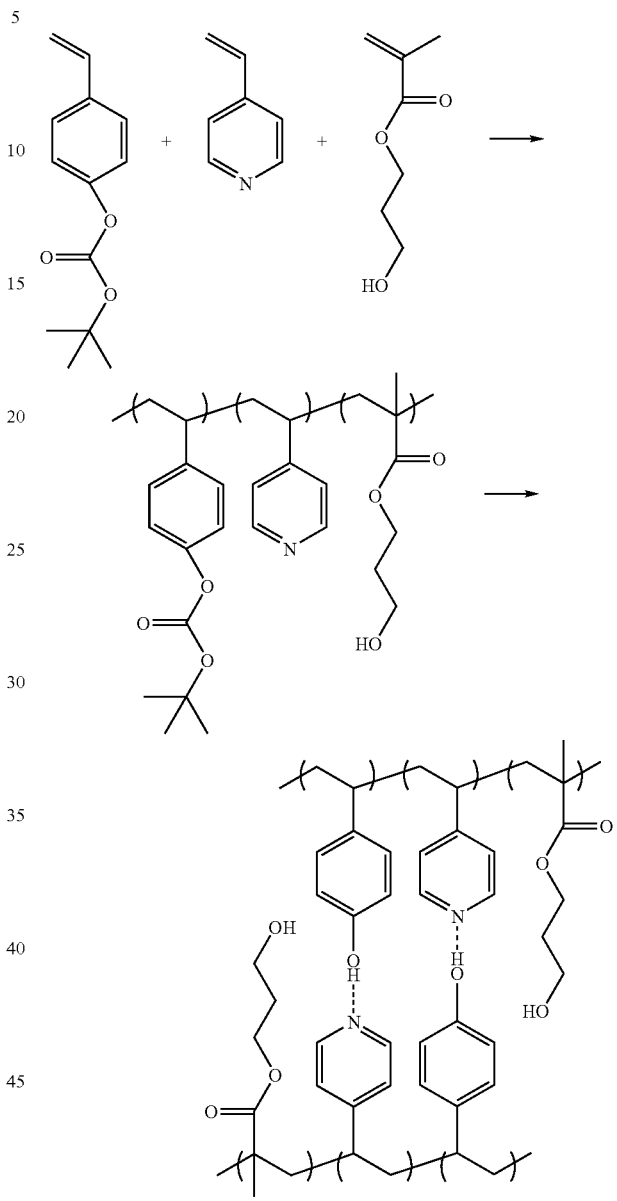

Example 7

Preparation of Compositions with Noncrosslinking Monomer and Strong Hydrogen Bond Acceptor 1. Preparation of Copolymers To prepare the polymer mother liquor 0.94 gram of 4-VPY, 4.4 grams of TBSM, 2.16 grams of HPMA, 0.785 gram of dimethylaminoethyl methacrylate ("DMAEMA," Sigma-Aldrich Co.), 41.3 grams of PGME, and 0.41 gram of AIBN were added to a 100-ml round-bottom flask. The flask was sealed and purged with nitrogen, and the mixture was stirred until the TBSM and AIBN were in solution. The mixture was then heated in a silicone oil bath and allowed to react at 70° C. for 18 hours. After 18 hours, the polymer solution was cooled to room temperature, filtered through a 0.1-μm endpoint filter, and bottled.

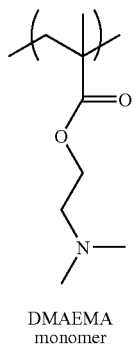

DMAEMA monomer

The undiluted polymer mother liquor was used as the composition and spin-coated onto silicon wafers.

The solvent resistance and film develop rates of the composition were then determined. For each test, the composition was spin-coated at 1,500 rpm for 60 seconds onto 100-mm silicon wafers. The wafers were baked at 205° C. for 60 seconds using a contact hot plate to induce non-covalent crosslinking of the composition. The thickness of the resulting film was measured using an ellipsometer.

Solvent resistance tests were then performed by applying a common resist solvent (i.e., ethyl lactate) to the film for 20 seconds, followed by spin-drying at 2,500 rpm for 30 seconds. Subsequent film thickness measurements were made on the ellipsometer to determine the film loss, as shown in the table below.

TABLE 7

| Initial Thickness (Å) | Thickness after solvent rinse (Å) | % strip |
|---|---|---|
| 3754 | 3717 | 1.0 |

The composition showed resistance to the ethyl lactate.

Film develop rates were then measured using a resist development analyzer. Silicon wafers were again coated with the composition and baked as described above. The wafer was immersed in TMAH, while the analyzer measured the rate at which the film was removed. The develop rate of the composition was 19.5 nm/s.

The following reaction scheme shows the polymer preparation as well as the subsequent induced non-covalent crosslinking.

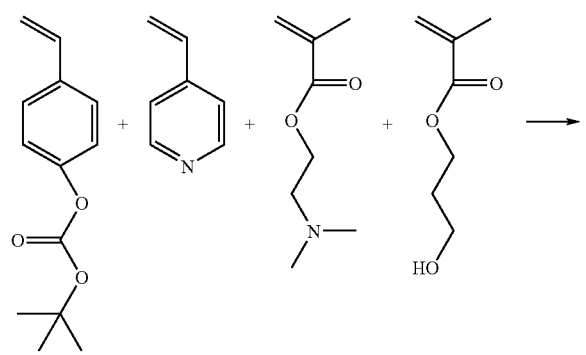

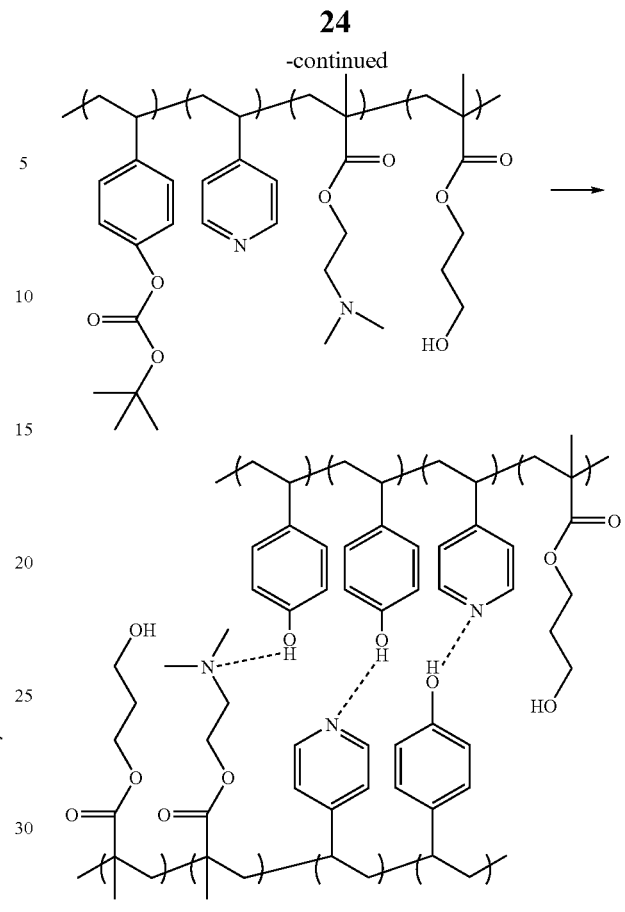

Example 8

Preparation of Compositions with Vinyl Imidozole as Hydrogen Bond Acceptor

1. Preparation of Copolymers

To prepare the polymer mother liquor, 1.41 grams of vinyl imidazole, 4.4 grams of TBSM 1.50 gram of methyl methacrylate ("MMA," Sigma-Aldrich Co.), 42.3 grams of PGME, and 0.41 gram of AIBN were added to a 100-ml round-bottom flask. The flask was sealed and purged with nitrogen, and the mixture was stirred until the TBSM and AIBN were in solution. The mixture was then heated in a silicone oil bath and allowed to react at 70° C. for 22 hours. After 22 hours, the polymer solution was cooled to room temperature and bottled. The solution had 15.44% solids.

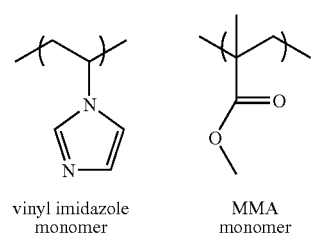

vinyl imidazole monomer     MMA monomer

2. Preparation of Composition

The inventive composition was prepared by mixing 7 grams of the polymer solution prepared above (1.07 grams of polymer solids and 5.93 grams of PGME) with 3 grams of PGMEA. The resulting composition had a total weight of 10 grams, with 10.7% solids.

3. Composition Testing

The solvent resistance and film develop rates of the composition were then determined. For each test, the composition was spin-coated at 1,500 rpm for 60 seconds onto 100-mm silicon wafers. The wafers were then baked at 205° C. for 60 seconds using a contact hot plate to induce non-covalent crosslinking of the composition. The thickness of the resulting film was measured using an ellipsometer.

Solvent resistance tests were then performed by applying a common resist solvent (i.e., ethyl lactate) to the film for 20 seconds, followed by spin-drying at 2,500 rpm for 30 seconds. Subsequent film thickness measurements were made on the ellipsometer to determine the film loss, as shown in the table below.

TABLE 8

| Initial Thickness (Å) | Thickness after solvent rinse (Å) | % strip |
|---|---|---|
| 3068 | 3026 | 1.37 |

The composition showed resistance to the ethyl lactate.

Film develop rates were then measured using a resist development analyzer. Silicon wafers were again coated with the composition and baked as described above. The wafer was immersed in TMAH, while the analyzer measured the rate at which the film was removed. The develop rate of the composition was 7.8 nm/s.

The following reaction scheme shows the polymer preparation as well as the subsequent induced non-covalent crosslinking.

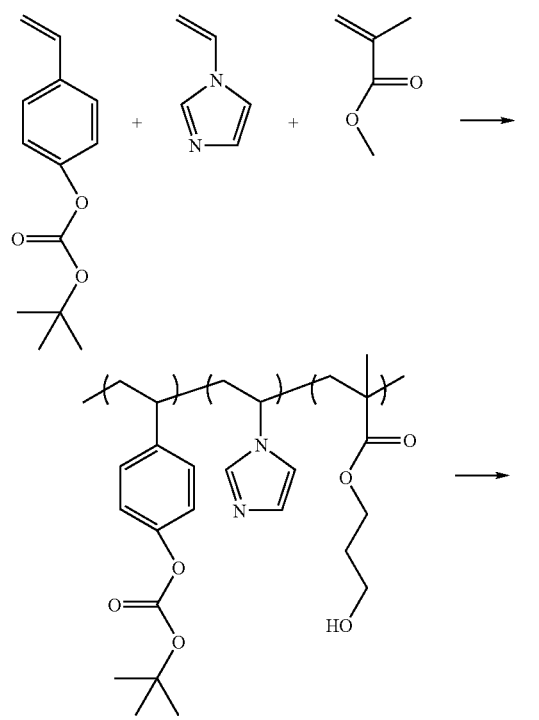

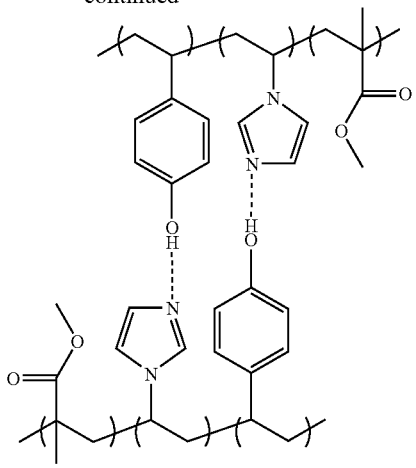

Example 9

Preparation of Compositions with Electrostatic Bonding

1. Preparation of Copolymers

To prepare the polymer mother liquor, 4.75 grams of tert-butyl methacrylate, 5.25 grams of DMAEMA, 40.0 grams of PGME, and 0.25 grams of AIBN were added to a 100-ml round-bottom flask. The flask was sealed and purged with nitrogen, and the mixture was stirred until the AIBN was in solution. The mixture was then heated in a silicone oil bath and allowed to react at 60° C. for 16 hours. After 16 hours, the polymer solution was cooled to room temperature and bottled. The resulting polymer had the following structure:

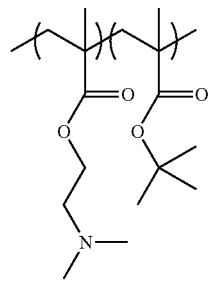

2. Preparation of Composition

A composition was prepared by mixing 5.0 grams of the polymer solution prepared above (1.02 grams of polymer solids and 3.98 grams of PGME) with 5.0 grams of PGME and 0.02 grams of pTSA.

3. Composition Testing

The solvent resistance and film develop rates of the composition were then determined. For each test, the composition was spin-coated at 1,500 rpm for 60 seconds onto a silicon wafer and baked at 250° C. for 60 seconds. The thickness of the resulting film was measured using an ellipsometer. Solvent resistance tests were then performed by applying a common resist solvent (i.e., ethyl lactate) to the film for 20 seconds, followed by spin-drying at 2,500 rpm for 30 seconds. Subsequent film thickness measurements were made on the ellipsometer to determine the film loss.

The composition was not soluble in ethyl lactate or TMAH developer.

The following reaction scheme shows the induced non-covalent crosslinking.

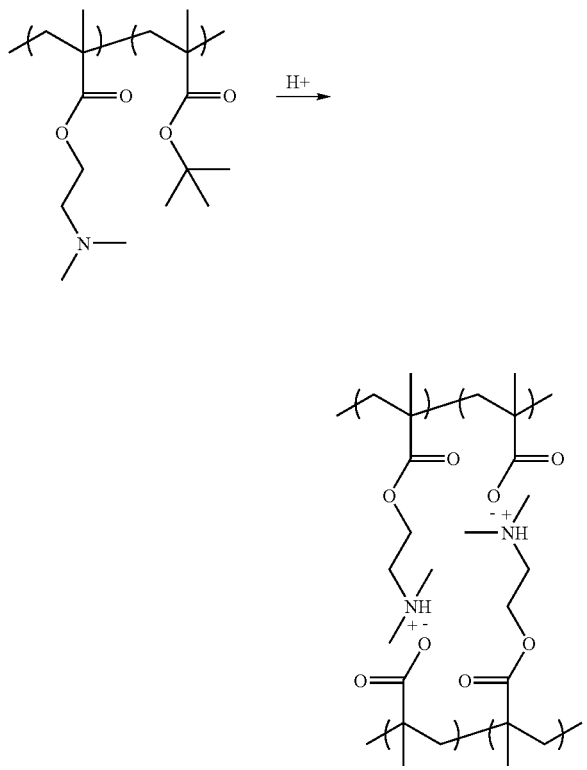

Example 10

Gap Fill Composition Used as a Spin-On-Carbon Layer for Trilayer Lithography The gap fill composition from Example 3 was spin-coated at 1,500 rpm for 60 seconds onto wafer substrates. The coated wafers were then baked at 20° C. on a contact hot plate for 60 seconds to induce the non-covalent crosslinking of the composition.

A silicon-containing hardmask material (available under the name BSI.M06099B, from Brewer Science, Inc.) was then spin-coated on top of the previous layer at 1,500 rpm for 60 seconds and baked for 60 seconds at 205° C. on a hotplate to provide a 40-nm thick layer. Then, 120 nm of a 193-nm photoresist (ARX3001JN, obtained from JSR) was coated on top of the hardmask, completing the trilayer stack.

Figure 4:
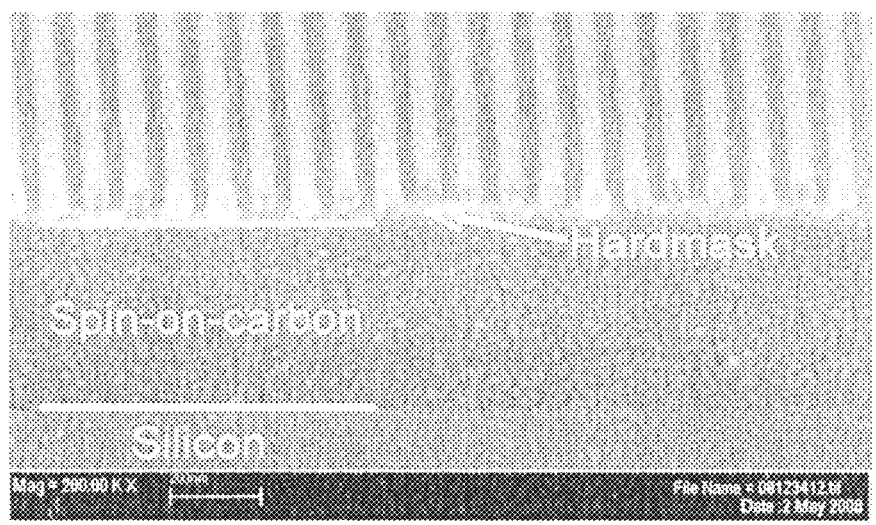
FIG. 4 is a scanning electron microscope (SEM) photograph showing the patterned stack of Example 10.

Photolithography was performed on the trilayer stack using an Amphibian XIS interferometric exposure tool (obtained from Amphibian Systems), using water as an immersion fluid. FIG. 4 illustrates an SEM picture of 45-nm dense lines patterned into the photoresist.

The relative etch rates were also examined using a Plasmalab 80+ (obtained from Oxford) reactive ion etcher. The etcher settings were 100 W power, 50 mTorr gas pressure, and 50 sccm gas flow rate. The etch rate selectivity values are shown in the table below.

TABLE 9

| ETCH GAS | ETCH RATE SELECTIVITY GAP FILL VS. HARD MASK |
|---|---|
| $CF_4$ | 1.25 |
| $O_2$ | 17.5 |

Example 11

Preparation of Compositions with Non-Covalently Bound Protecting Group

The inventive composition was prepared by mixing 1.07 grams of poly(hydroxystyrene) (Aldrich, Mw=8,000), 0.93 grams poly(4-vinylpyridine) (Aldrich, Mw=60,000), 7.13 grams acetic acid, 16.65 grams PGME, 7.21 grams EL, and 7.13 grams methanol.

The solvent resistance of the composition was then determined. For each test, the composition was spin-coated at 11,500 rpm for 60 seconds onto a silicon wafer and baked at 205° C. for 60 seconds. The thickness of the resulting film was measured using an ellipsometer. Solvent resistance tests were performed by applying ethyl lactate to the film for 20 seconds, followed by spin-drying at 2,500 rpm for 30 seconds. Subsequent film thickness measurements were made on the ellipsometer to determine the film loss.

TABLE 10

| Initial Thickness (nm) | Thickness After Solvent Rinse (nm) | % Strip |
|---|---|---|
| 924 | 923 | 0.03 |

We claim:

1. The combination of:
   a substrate having a surface; and
   a non-covalently crosslinked layer adjacent said surface, said layer formed from a composition comprising a polymer dissolved or dispersed in a solvent system, said polymer being a copolymer comprised of at least two different recurring monomers, said monomers being selected from the group consisting of:

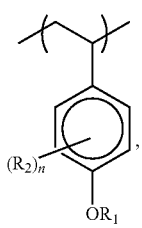

I

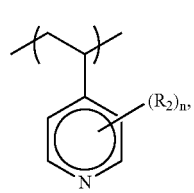

II

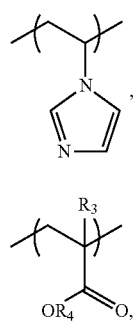

and combinations of the foregoing, wherein:

n is 0 to 4;

$R_1$ is a protecting group;

each $R_2$ is individually selected from the group consisting of alkyls, halogens, —OH, and multifunctional phenols;

$R_3$ is selected from the group consisting of H, alkyls, —CN, —Br, and —Cl; and $R_4$ is selected from the group consisting of alkyls,

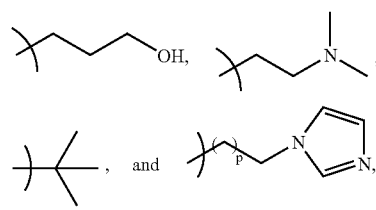

where p is 0-2; and at least one of (I) and (IV) is present, and at least one of (II) and (III) is present, wherein said non-covalently crosslinked layer is substantially insoluble in photoresist solvents.

2. The combination of claim 1, wherein $R_1$ is selected from the group consisting of

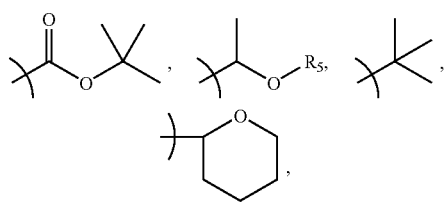

where $R_5$ is selected from the group consisting of alkyls.

3. The combination of claim 1, wherein said recurring monomers comprise (I) and (II).

4. The combination of claim 3, wherein the molar ratio of (I):(II) is from about 1:3 to about 3:1.

5. The combination of claim 1, wherein said non-covalently crosslinked layer comprises crosslinked polymers having a formula selected from the group consisting of

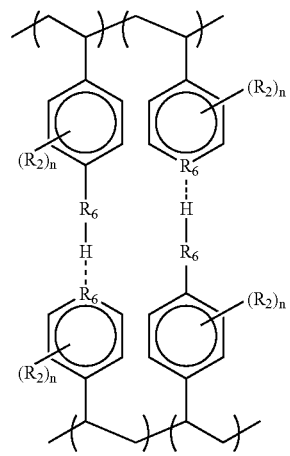

and

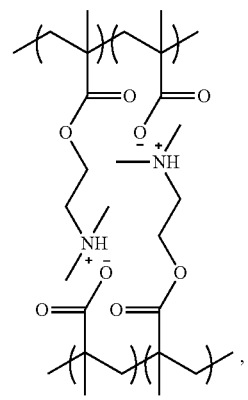

wherein:

n is 0-4;

each $R_2$ is individually selected from the group consisting of alkyls, halogens, —OH, and multifunctional phenols; and each $R_6$ is individually selected from the group consisting of —O— and.

6. The combination of claim 1, said substrate having a surface comprising a plurality of topography features, said topography features forming a dense region and an isolated region on said substrate.

7. The combination of claim 1, wherein at least one of said monomers is a hydrogen donor and the other of said monomers is a hydrogen acceptor.

8. The combination of claim 7, wherein the molar ratio of hydrogen donor to hydrogen acceptor in said polymer is from about 1:3 to about 3:1.

9. The combination of claim 1, wherein said substrate is a microelectronic substrate.

10. The combination of claim 9, wherein said substrate is selected from the group consisting of silicon, aluminum, tungsten, tungsten silicide, gallium arsenide, germanium, tantalum, tantalum nitrite, silicon germanium, silicon dioxide, silicon nitride, aluminum oxide, glass, quartz, and low k dielectrics.

11. The combination of claim 1, wherein said layer is substantially soluble in photoresist developers.

12. The combination of claim 1, wherein said recurring monomer (IV) is present, and where $R_4$ is selected from the group consisting of alkyls,

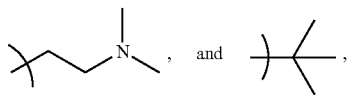

wherein said composition is not wet developable.

13. The combination of claim 1, wherein said composition is a spin-on carbon composition.

14. The combination of claim 1, wherein said composition is a hardmask.

15. The combination of:
a microelectronic substrate having a surface;
a layer adjacent said substrate, said layer being formed from a composition comprising a polymer dispersed or dissolved in a solvent system, said polymer comprising a hydrogen donor and a hydrogen acceptor, wherein:
the molar ratio of hydrogen donor to hydrogen acceptor is from about 1:3 to about 3:1;
at least one of said hydrogen donor or hydrogen acceptor comprises a protecting group; and
said layer comprises a non-covalently crosslinked compound comprising linkages having the formula selected from the group consisting of —OH—O, —OH—N, —NH—O, or —NH—N, and combinations of the foregoing; and
said layer is substantially insoluble in photoresist solvents; and
a second layer adjacent said layer, said second layer being selected from the group consisting of anti-reflective layers, photoresists, and hard masks.

16. The combination of claim 15, wherein said substrate is selected from the group consisting of silicon, aluminum, tungsten, tungsten silicide, gallium arsenide, germanium, tantalum, tantalum nitrite, silicon germanium, silicon dioxide, silicon nitride, aluminum oxide, glass, quartz, and low k dielectrics.

17. The combination of claim 15, wherein the molar ratio of hydrogen donor to hydrogen acceptor is from about 2:3 to about 3:2.

18. The combination of claim 1, wherein the molar ratio of (I):(III) is from about 1:3 to about 3:1.

19. The combination of claim 1, wherein the molar ratio of (IV):(II) is from about 1:3 to about 3:1.

20. The combination of claim 1, wherein the molar ratio of (IV):(III) is from about 1:3 to about 3:1.

21. The combination of claim 15, wherein said second layer is a photoresist.

22. The combination of claim 15, wherein said second layer is a hard mask and further comprising a photoresist on said hardmask.

23. The combination of claim 15, wherein said layer is substantially insoluble in photoresist solvents selected from the group consisting of ethyl lactate, PGME, and PGMEA.

24. The combination of claim 15, wherein said layer, when subjected to a stripping test, will have a percent stripping of less than about 5%.

* * * * *